United States Patent
Ishizuka

(10) Patent No.: US 10,305,184 B2
(45) Date of Patent: May 28, 2019

(54) ANTENNA MATCHING CIRCUIT, ANTENNA MATCHING MODULE, ANTENNA DEVICE AND WIRELESS COMMUNICATION DEVICE

(71) Applicant: Murata Manufacturing Co., Ltd., Nagaokakyo-shi, Kyoto-fu (JP)

(72) Inventor: Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 245 days.

(21) Appl. No.: 15/352,665

(22) Filed: Nov. 16, 2016

(65) Prior Publication Data

US 2017/0084998 A1    Mar. 23, 2017

Related U.S. Application Data

(63) Continuation of application No. PCT/JP2015/063173, filed on May 7, 2015.

(30) Foreign Application Priority Data

May 19, 2014  (JP) ................................ 2014-103018
Jun. 17, 2014  (JP) ................................ 2014-124564

(51) Int. Cl.
*H01Q 1/50* (2006.01)
*H01Q 5/335* (2015.01)
(Continued)

(52) U.S. Cl.
CPC ............. *H01Q 5/335* (2015.01); *H01Q 1/243* (2013.01); *H01Q 1/50* (2013.01); *H03H 7/38* (2013.01); *H04B 1/04* (2013.01); *H04B 1/40* (2013.01)

(58) Field of Classification Search
None
See application file for complete search history.

(56) References Cited

U.S. PATENT DOCUMENTS 8,098,114 B2 *  1/2012  Fukuda .................... H01P 5/02
                                                            333/235
9,264,011 B2 *  2/2016  Ishizuka .................. H03H 7/38
(Continued)

FOREIGN PATENT DOCUMENTS

JP       53-15039 A      2/1978
JP       63-177622 A     7/1988
(Continued)

OTHER PUBLICATIONS

Official Communication issued in corresponding International Application PCT/JP2015/063173, dated Jul. 14, 2015.

*Primary Examiner* — Trinh V Dinh
(74) *Attorney, Agent, or Firm* — Keating & Bennett, LLP

(57) ABSTRACT

An antenna device includes an antenna element, which is able to transmit and receive high-frequency signals of a plurality of frequency bands, and an antenna matching circuit. The antenna matching circuit includes an impedance converting circuit, which is connected to the antenna element side of the circuit, and a variable reactance circuit, which is connected to a feeder circuit side of the circuit. The impedance converting circuit includes a first inductance element and a second inductance element, which are transformer coupled with each other. The variable reactance circuit includes a reactance element, which is connected in parallel or series with the transmission/reception signal transmission path, and a switch that switches the connection state of the reactance element.

18 Claims, 16 Drawing Sheets

(51) Int. Cl.
*H03H 7/38* (2006.01)
*H04B 1/04* (2006.01)
*H04B 1/40* (2015.01)
*H01Q 1/24* (2006.01)

(56) References Cited

U.S. PATENT DOCUMENTS

| | | | |
|---|---|---|---|
| 2004/0100341 A1* | 5/2004 | Luetzelschwab | H03F 1/56 |
| | | | 333/32 |
| 2007/0018758 A1 | 1/2007 | Fukuda et al. | |
| 2013/0063223 A1* | 3/2013 | See | H03H 7/38 |
| | | | 333/32 |
| 2013/0207872 A1 | 8/2013 | Bakalski | |
| 2013/0214979 A1* | 8/2013 | McMilin | H01Q 9/42 |
| | | | 343/750 |
| 2013/0335291 A1* | 12/2013 | Judson | H01Q 1/50 |
| | | | 343/861 |
| 2014/0062817 A1 | 3/2014 | Ishizuka et al. | |
| 2014/0266964 A1* | 9/2014 | Kato | H01Q 5/335 |
| | | | 343/860 |
| 2015/0035710 A1* | 2/2015 | Lin | H01Q 1/283 |
| | | | 343/745 |
| 2015/0087254 A1* | 3/2015 | Iwanaga | H03H 7/38 |
| | | | 455/248.1 |
| 2017/0133999 A1* | 5/2017 | Ishizuka | H03H 7/18 |

FOREIGN PATENT DOCUMENTS

| | | |
|---|---|---|
| JP | 2-48832 A | 2/1990 |
| JP | 2-261209 A | 10/1990 |
| JP | 2006-325163 A | 11/2006 |
| JP | 2009-177579 A | 8/2009 |
| JP | 2011-55258 A | 3/2011 |
| JP | 2013-70143 A | 4/2013 |
| WO | 2004/082138 A1 | 9/2004 |
| WO | 2012/153692 A1 | 11/2012 |
| WO | 2013/040272 A2 | 3/2013 |

* cited by examiner

Frequency (600MHz to 1.000GHz)

Frequency (600MHz to 1.000GHz)

FIG. 14A  FIG. 14 B  FIG. 14C
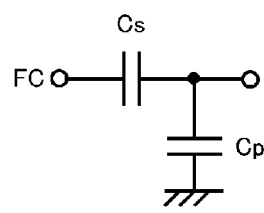
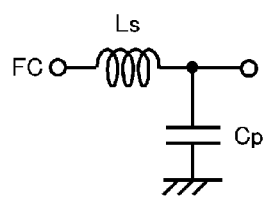
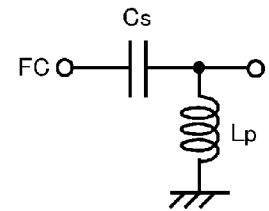
FIG. 15 A  FIG. 15B  FIG. 15C
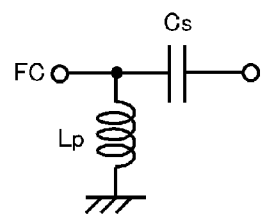
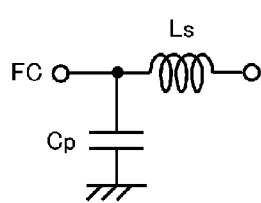
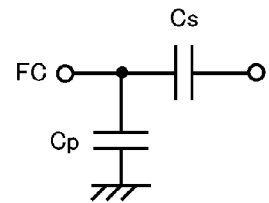

ANTENNA MATCHING CIRCUIT, ANTENNA MATCHING MODULE, ANTENNA DEVICE AND WIRELESS COMMUNICATION DEVICE

CROSS REFERENCE TO RELATED APPLICATIONS

This application claims the benefit of priority to Japanese Patent Application No. 2014-124564 filed Jun. 17, 2014 and Japanese Patent Application No. 2014-103018 filed May 19, 2014, and is a Continuation Application of PCT Application No. PCT/JP2015/063173 filed on May 7, 2015. The entire contents of each application are hereby incorporated herein by reference.

BACKGROUND OF THE INVENTION

1. Field of the Invention

The present invention relates to an antenna matching circuit, an antenna matching module, an antenna device and a wireless communication device that provide UHF-band communication, for example.

2. Description of the Related Art

Japanese Unexamined Patent Application Publication No. 2011-55258 discloses a multiband antenna device that is used in a cellular phone terminal, for example. FIG. 21 shows the antenna device of Patent Japanese Unexamined Patent Application Publication No. 2011-55258.

FIG. 21 shows an example of a low-band-side or high-band-side variable matching circuit. This variable matching circuit includes a variable reactance unit RC and a matching unit M. The variable reactance unit RC includes a parallel circuit consisting of an inductor La and a capacitor Ca and this parallel circuit is connected in series with a base part of an antenna element 20. The matching unit M includes a parallel circuit consisting of an inductor Lb and a capacitor Cb and this parallel circuit is connected in parallel between a feeder circuit 10 and the variable reactance unit RC.

As shown in FIG. 21, the bandwidth of the antenna can be increased by actively switching the reactance generated by the variable reactance unit.

However, due to the demand for size reduction of wireless communication devices in recent years, the space for the antenna in antenna devices is becoming ever more restricted. Together with this, there is a tendency for the input impedance of antennas to become increasingly lower. When the variable reactance unit RC and the matching unit M include reactance elements and a switch, power loss due to the switch relatively increases as the impedance of the antenna element 20 becomes lower.

Even if the reactance is switched using a switch after matching the impedance of the antenna element using a reactance element (after increasing the impedance of the antenna element) in order to avoid this increase in loss, it is not possible to change the resonant frequency of the antenna over a large range in such a case. Furthermore, since the impedance cannot be (simultaneously) converted across a wide bandwidth when the impedance is changed using an inductor, a capacitor or the like, the loss due to a switch increases at the ends of the frequency band in which matching is being attempted.

SUMMARY OF THE INVENTION

Preferred embodiments of the present invention provide an antenna matching circuit that is able to increase the range over which the resonant frequency of an antenna is able to change while significantly reducing or preventing loss due to a switch, and to provide an antenna device and a wireless communication device that includes the antenna device.

According to a preferred embodiment of the present invention, an antenna matching circuit is connected between a feeder circuit connection portion, which is connected to a feeder circuit, and an antenna element connection portion, which is connected to an antenna element, and includes an impedance converting circuit that is connected to an antenna-element side of the antenna matching circuit; and a variable reactance circuit that is connected to a feeder-circuit side of the antenna matching circuit; wherein the impedance converting circuit includes a first inductance element and a second inductance element, which are transformer coupled with each other, and the variable reactance circuit includes a reactance element that is connected in parallel or series with a transmission/reception signal transmission path and includes a switch that switches a connection of the reactance element.

With the features described above, degradation (increasing) of the Q value of the antenna element does not occur when the impedance is increased by the impedance converting circuit including a transformer structure. In addition, because of the presence of the impedance converting circuit including a transformer structure, the impedance converting ratio has substantially no frequency dependence and impedance matching is able to be provided across a wide bandwidth by switching the reactance with a switch. In particular, the impedance in a desired band is able to be easily moved to the first quadrant or fourth quadrant of a Smith chart through impedance conversion by the transformer (the impedance in the desired band is able to be easily increased) and consequently the effect of loss in a subsequent (feeder circuit side) circuit is able to be significantly reduced or prevented.

According to a preferred embodiment of the present invention, the first inductance element is connected in series with the transmission/reception signal transmission path and the second inductance element is connected in parallel with a connection point between the first inductance element and the antenna element. Therefore, the impedance converting circuit provides an auto transformer circuit, and by utilizing the parasitic inductance of the impedance converting circuit, the amount by which the impedance is changed by the reactance element is able to be reduced. As a result, it is possible to significantly reduce or prevent bandwidth narrowing caused by adding a reactance element.

According to a preferred embodiment of the present invention, the reactance element includes a capacitance element that is connected in series with the transmission/reception signal transmission path and a capacitance element that is connected in parallel with (shunt connected with) the transmission/reception signal transmission path via a switch. Thus, an impedance that becomes inductive due to the parallel parasitic inductance of the auto transformer circuit is able to be easily matched by a series-connected capacitance element or by a series-connected capacitance element and a parallel-connected capacitance element.

According to a preferred embodiment of the present invention, an antenna matching circuit module is connected between a feeder circuit connection portion, which is connected to a feeder circuit, and an antenna element connection portion, which is connected to an antenna element, and includes an impedance converting circuit that is connected to an antenna-element side of the antenna matching circuit module; and a variable reactance circuit that is connected to a feeder-circuit side of the antenna matching circuit module; wherein the impedance converting circuit includes a first inductance element and a second inductance element, which are transformer coupled with each other and are included in a multilayer element body formed by stacking a plurality of dielectric layers, and the variable reactance circuit includes a reactance element that is mounted on or included in the multilayer element body and is connected in parallel or series with a transmission/reception signal transmission path, and includes a switch that is mounted on the multilayer element body and switches a connection of the reactance element.

According to a preferred embodiment of the present invention, an antenna device includes an antenna element; and an antenna matching circuit that is connected to the antenna element; wherein the antenna matching circuit is an antenna matching circuit as described above.

According to a preferred embodiment of the present invention, a wireless communication device includes an antenna device; and a wireless communication circuit that is connected to the antenna device; wherein the antenna device is an antenna device as described above.

With the features described above, communication is able to be performed across a wide bandwidth with high gain with a small antenna device.

According to preferred embodiments of the present invention, an antenna device and a wireless communication device provide high gain across a wide bandwidth without increasing the size of the antenna element.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 14A, 14B, and 14C show examples of a variable reactance circuit provided when the impedance seen when looking toward the impedance converting circuit from the variable reactance circuit is in the first quadrant or the fourth quadrant of a Smith chart.

FIGS. 15A, 15B, and 15C show examples of a variable reactance circuit provided when the impedance seen when looking toward the impedance converting circuit from the variable reactance circuit is in the second quadrant or the third quadrant of a Smith chart.

DETAILED DESCRIPTION OF THE PREFERRED EMBODIMENTS

First Preferred Embodiment

Figure 1A:
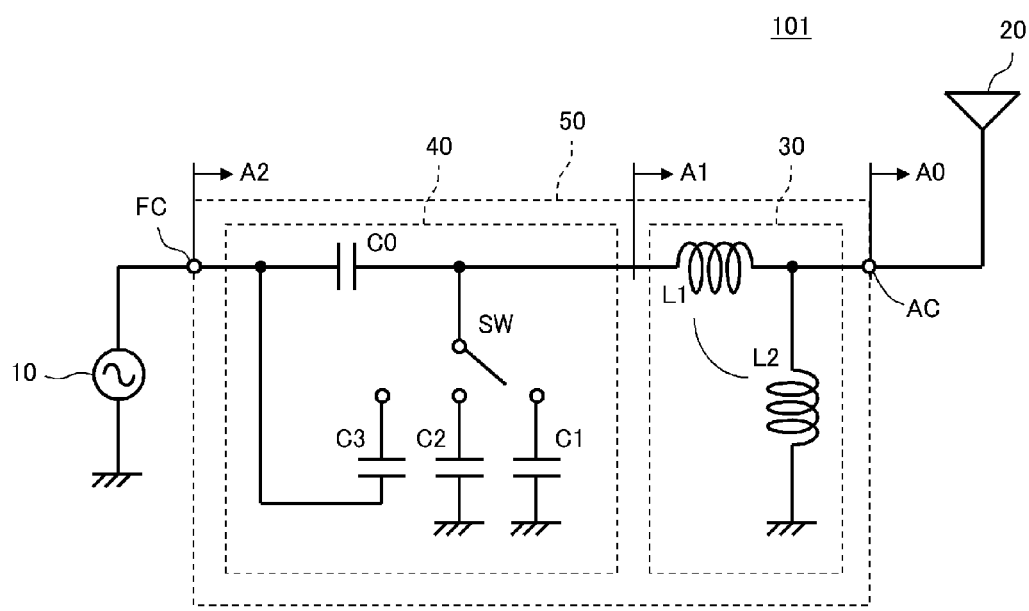
FIGS. 1A and 1B are circuit diagrams of an antenna device according to a first preferred embodiment of the present invention.
Figure 1B:
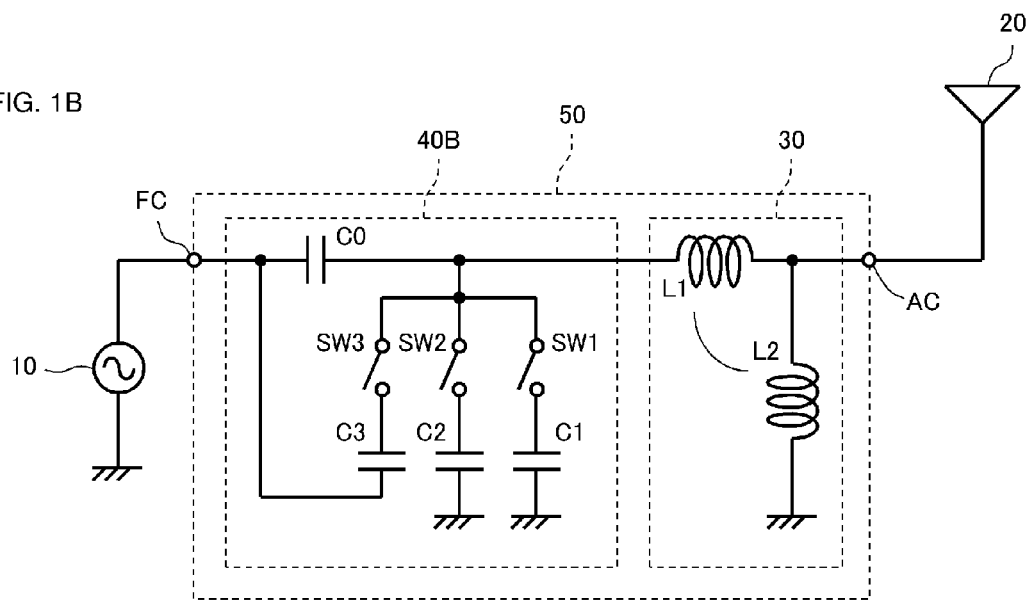

FIGS. 1A and 1B show circuit diagrams of an antenna matching circuit 50 and an antenna device 101 according to a first preferred embodiment of the present invention. The antenna device 101 includes of an antenna element 20 and the antenna matching circuit 50. A feeder circuit 10 is connected to a feeder circuit connection portion FC of the antenna matching circuit 50 and the antenna element 20 is connected to an antenna element connection portion AC. The antenna matching circuit 50 includes an impedance converting circuit 30, which is connected to the antenna element 20 side of the antenna matching circuit 50, and a variable reactance circuit 40, which is connected to the feeder circuit 10 side of the antenna matching circuit 50.

The antenna element 20 is able to transmit and receive high-frequency signals in a band of about 700 MHz to about 960 MHz.

The impedance converting circuit 30 includes a first inductance element L1 and a second inductance element L2, which are transformer coupled with each other, and an auto transformer circuit includes the first inductance element L1 and the second inductance element L2.

The variable reactance circuit 40 shown in FIG. 1A includes reactance elements that are connected in parallel or in series with a transmission/reception signal transmission path and a switch that switches the connection of the reactance elements. As shown in FIG. 1A, a capacitor C0 is connected in series with the transmission/reception signal transmission path, a capacitor C1 is connected in parallel with the transmission/reception signal transmission path when the capacitor C1 is selected by a switch SW, a capacitor C2 is connected in parallel with the transmission/reception signal transmission path when the capacitor C2 is selected by the switch SW, and a capacitor C3 is connected in parallel with the capacitor C0 when the capacitor C3 is selected by the switch SW.

A variable reactance circuit 40B shown in FIG. 1B includes reactance elements that are connected in parallel or in series with the transmission/reception signal transmission path. The variable reactance circuit 40B also includes switches that switch the connection of the reactance elements. As shown in FIG. 1B, the capacitor C0 is connected in series with the transmission/reception signal transmission path, the capacitor C1 is connected in parallel (shunt connected) with the transmission/reception signal transmission path in an on-state of a switch SW1, the capacitor C2 is connected in parallel (shunt connected) with the transmission/reception signal transmission path in an on-state of a switch SW2 and the capacitor C3 is connected in parallel with the capacitor C0 in an on-state of a switch SW3.

Figure 2A:
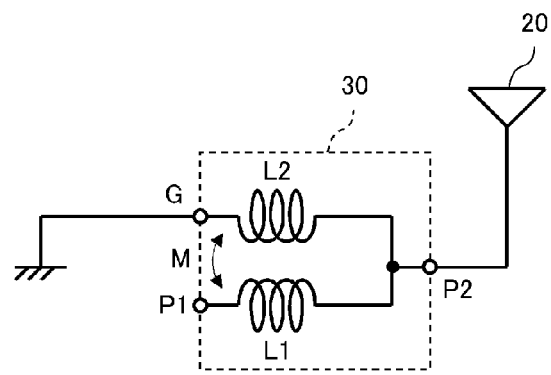
FIG. 2A shows a circuit diagram of an impedance converting circuit.
Figure 2B:
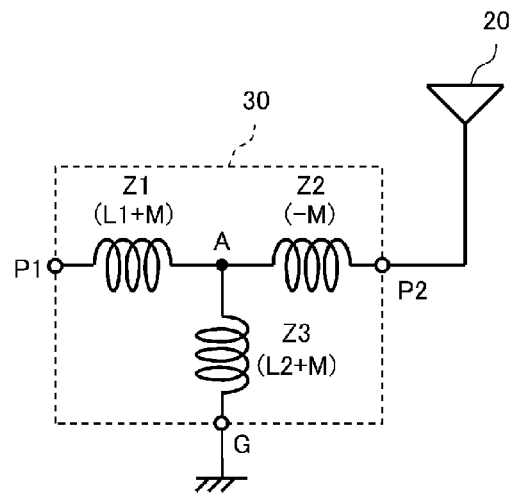
FIG. 2B shows an equivalent circuit diagram of the impedance converting circuit.

FIG. 2A shows a circuit diagram of the impedance converting circuit 30, and FIG. 2B shows an equivalent circuit diagram of the impedance converting circuit 30. The impedance converting circuit 30 includes an auto transformer circuit in which the first inductance element L1 and the second inductance element L2 are coupled with each other through a mutual inductance M. As shown in FIG. 2B, the auto transformer circuit is able to be equivalently converted into a T circuit that includes three inductance elements Z1, Z2 and Z3. That is, the T circuit includes: a first port P1, which is on the feeder circuit side of the T circuit; a second port P2, which is connected to the antenna element 20; a ground terminal G, which is connected to ground; an inductance element Z1, which is connected between the first port P1 and a branching point A; an inductance element Z2, which is connected between the second port P2 and the branching point A, and a third inductance element Z3, which is connected between the ground terminal G and the branching point A.

In FIG. 2A, if the inductance of the first inductance element L1 is denoted as L1, the inductance of the second inductance element L2 is denoted as L2, and the mutual inductance is denoted as M, in FIG. 2B, the inductance of the inductance element Z1 is L1+M, the inductance of the inductance element Z2 is −M and the inductance of the inductance element Z3 is L2+M.

The portion (inductance elements Z1 and Z3) of the T circuit shown in FIG. 2B that is provided between the port P1, which is connected to the feeder circuit, and the ground terminal G, which is connected to ground, contributes to impedance conversion determined by a transformer ratio. That is, an impedance conversion ratio of the impedance converting circuit 30 is (L1+L2+2M):L2.

Figure 2C:
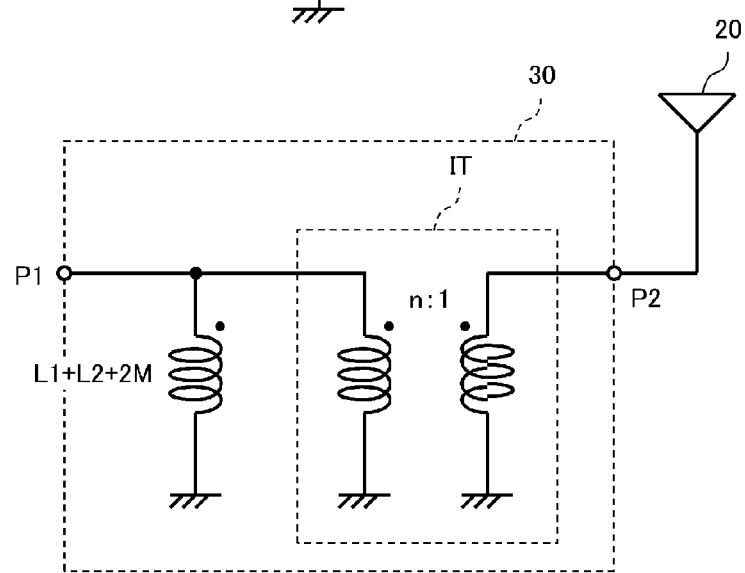
FIG. 2C is an equivalent circuit diagram of the impedance converting circuit.

FIG. 2C is an equivalent circuit diagram of the impedance converting circuit 30. Here, in order to simplify the explanation, the impedance converting circuit 30 is shown as including a shunt-connected inductor (parallel parasitic inductance) and an ideal transformer IT by setting a coupling coefficient k between the first inductance element L1 and the second inductance element L2 of the impedance converting circuit 30 to 1. Here, the inductance of the parallel parasitic inductor is (L1+L2+2M), where M=k·√(L1·L2). The ideal transformer IT is an impedance converting circuit including a turn ratio n between a primary coil and a secondary coil thereof of 1.

The parallel parasitic inductance is generated either due to a small transformer not including coils with a large inductance or due to a transformer not providing a large coupling coefficient k (k=1, for example). In other words, the parallel parasitic inductance is able to be set by determining the inductances of the inductance elements L1 and L2 and the coupling coefficient therebetween. As described in detail below, this parallel parasitic inductance is able to be effectively utilized.

Although a leakage inductance, which is a series parasitic inductance, is generated due to, for example, a magnetic body with high magnetic permeability at high frequencies not being included or an inductance element in a small transformer not including a high number of turns, the leakage inductance does not significantly contribute to conversion of the real part of the impedance.

Figure 3:
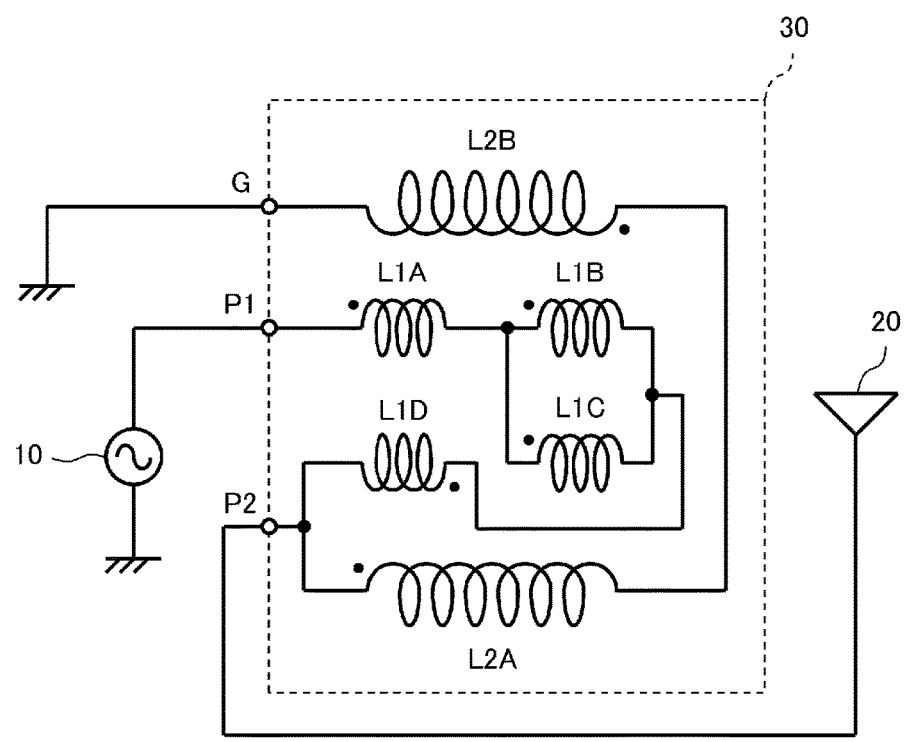
FIG. 3 is a circuit diagram showing a relationship between a primary coil and a secondary coil inside a multilayer element body of the impedance converting circuit shown in FIG. 2A.
Figure 4:
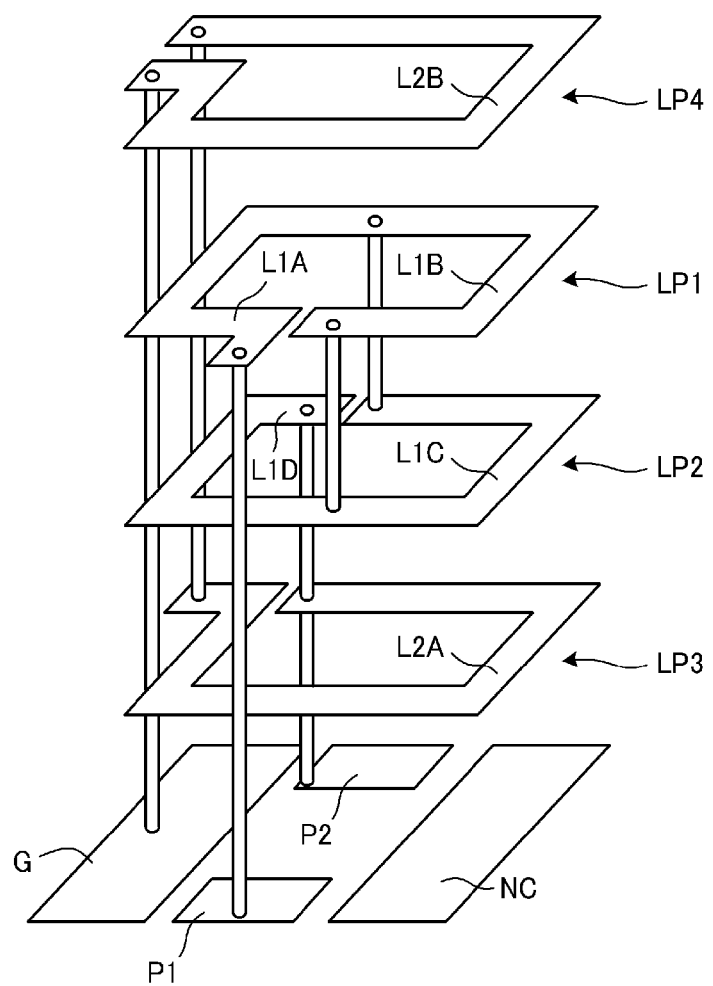
FIG. 4 is a perspective view of the various conductor patterns of the impedance converting circuit shown in FIG. 2A.

The impedance converting circuit 30 is defined by conductor patterns in a multilayer element body, which is preferably formed by stacking a plurality of dielectric substrate layers, for example. In other words, the impedance converting circuit 30 includes a multilayer structure in which dielectric substrate layers and conductor patterns are stacked on top of one another. FIG. 3 is a circuit diagram showing the arrangement relationship between a primary coil and a secondary coil inside a multilayer element body of the impedance converting circuit 30. FIG. 4 is a perspective view of various conductor patterns of the impedance converting circuit 30. The dielectric substrate layers on which these conductor patterns are provided is omitted for clarity.

Other than a dielectric material, the substrate layers may include a magnetic material. Coupling between the primary coil and the secondary coil is able to be increased by including a magnetic material, and including a magnetic material also provides a larger coupling coefficient. In addition, both magnetic material layers and dielectric material layers may be included.

As shown in FIG. 4, a first loop-shaped conductor LP1, which includes conductor patterns L1A and L1B, a second loop-shaped conductor LP2, which includes conductor patterns L1C and L1D, a third loop-shaped conductor LP3, which includes a conductor pattern L2A, and a fourth loop-shaped conductor LP4, which includes a conductor pattern L2B, are provided. The conductor patterns of the individual layers are connected to each other through via conductors.

Terminals corresponding to the first port (feeder port) P1, the second port (antenna port) P2, and the ground terminal G and other mounting terminals (for example, unused terminals NC) are located on the lower surface of the bottommost substrate layer. These terminals are located on the lower surface of the lowermost substrate layer.

As shown in FIG. 4, the first inductance element (L1 in FIG. 2A) includes the first loop-shaped conductor LP1 and the second loop-shaped conductor LP2. The second inductance element (L2 in FIG. 2A) includes the third loop-shaped conductor LP3 and the fourth loop-shaped conductor LP4.

The first loop-shaped conductor LP1 and the second loop-shaped conductor LP2 are located between the third loop-shaped conductor LP3 and the fourth loop-shaped conductor LP4 in the stacking direction.

The conductor pattern L1B, which defines one end of the first loop-shaped conductor LP1, and the conductor pattern L1C, which defines one end of the second loop-shaped conductor LP2, are connected in parallel with each other. The conductor pattern L1A, which defines the remaining portion of the first loop-shaped conductor LP1, and the conductor pattern L1D, which defines the remaining portion of the second loop-shaped conductor LP2, are connected in series with the parallel circuit.

The third loop-shaped conductor LP3, which includes the conductor pattern L2A, and the fourth loop-shaped conductor LP4, which includes the conductor pattern L2B, are connected in series with each other.

Figure 5A:
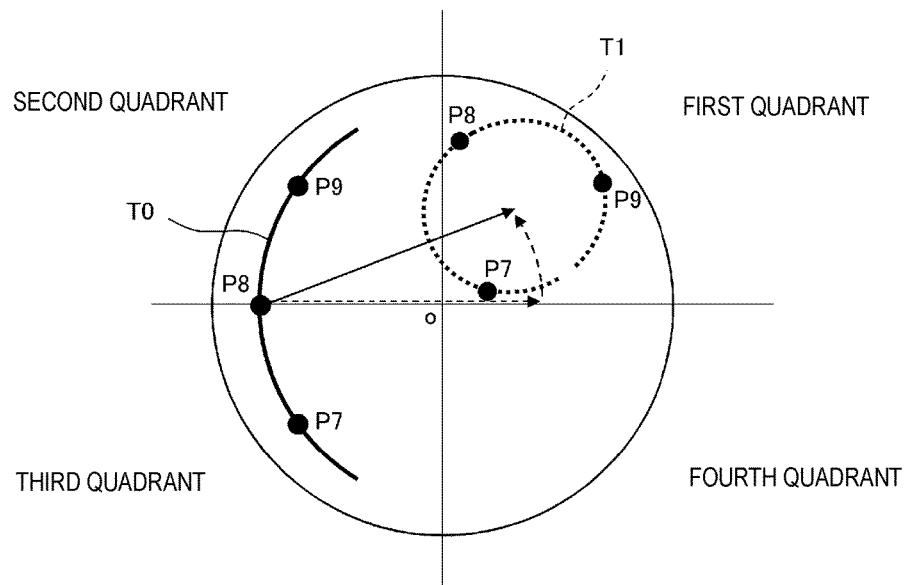
FIGS. 5A and 5B show movement of an impedance locus provided by an antenna matching circuit shown in FIG. 1.
Figure 5B:
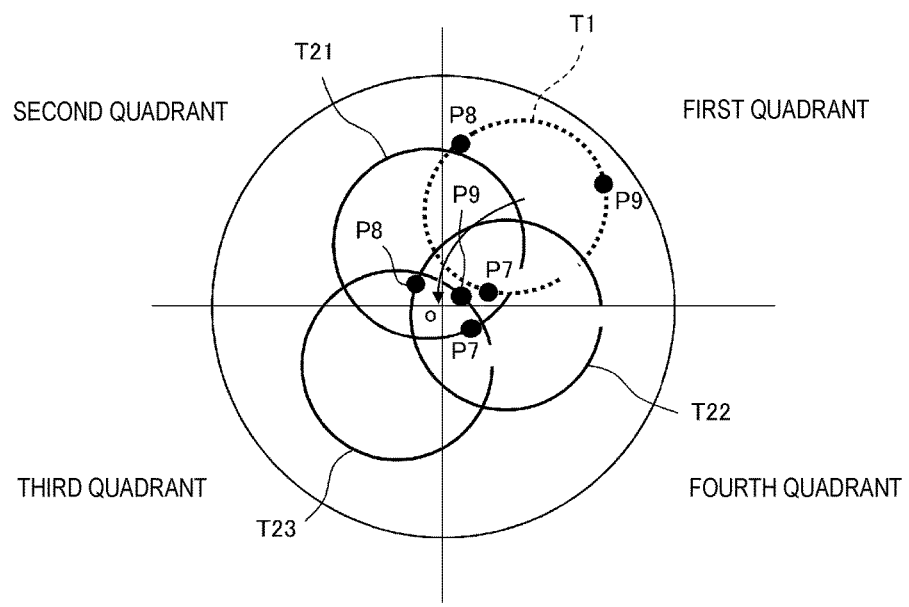

FIGS. 5A and 5B show movement of an impedance locus provided by the antenna matching circuit 50 shown in FIG. 1.

FIGS. 5A and 5B show the impedance seen when looking toward the antenna element 20 from points A0, A1 and A2 in FIG. 1 on a Smith chart. In FIG. 5A, a locus T0 is a locus of the impedance (impedance seen from A0 shown in FIG. 1) of the antenna element 20. In FIGS. 5A and 5B, a locus T1 is a locus of the impedance (impedance seen from A1 shown in FIG. 1) seen when looking toward the antenna element through the impedance converting circuit 30. In addition, in FIG. 5B, loci T21, T22 and T23 are loci of the impedances seen when looking toward the antenna element 20 from the feeder circuit 10 (A2 shown in FIG. 1) when the switches SW1, SW2 and SW3 of the variable reactance circuit 40 are in predetermined states. The frequency sweeping range is preferably about 700 to about 960 MHz in all cases. On the impedance loci, point P7 is at the position of a center frequency (about 720 MHz) of the 700 MHz band, point P8 is at the position of the center frequency (about 850 MHz) of the 800 MHz band and point P9 is at the position of the center frequency (about 920 MHz) of the 900 MHz band.

In the polar coordinates of a Smith chart, a first quadrant refers to a region in which the real part of a reflection coefficient (complex reflection coefficient ρ) is positive and the imaginary part of the reflection coefficient is positive, a second quadrant refers to a region in which the real part of the reflection coefficient is negative and the imaginary part of the reflection coefficient is positive, a third quadrant refers to a region in which the real part of the reflection coefficient is negative and the imaginary part of the reflection coefficient is negative, and a fourth quadrant refers to a region in which the real part of the reflection coefficient is positive and the imaginary part of the reflection coefficient is negative.

In the impedance converting circuit 30, the impedance locus is provided as a small circle and the impedance is increased by the ideal transformer IT shown in FIG. 2C. In addition, the center of the impedance locus, which has been provided as a small circle, is rotated counterclockwise along a circle of constant or substantially constant conductance by the parallel parasitic inductance shown in FIG. 2C. As a result, as shown in FIGS. 5A and 5B, the locus of the impedance seen when looking toward the antenna element 20 via the impedance converting circuit 30 is primarily located in the first quadrant in the Smith chart.

Due to the operation of the variable reactance circuit 40, the impedance seen when looking toward the antenna element 20 from the feeder circuit 10 moves toward the center of the Smith chart, as shown with respect to the loci T21, T22 and T23 in FIG. 5B. A switching state of the variable reactance circuit is determined to provide matching in the 700 MHz band, and as a result point P7 moves closer to a center o. In addition, a switching state of the variable reactance circuit is determined to provide matching in the 800 MHz band, and as a result point P8 moves closer to the center o. Similarly, a switching state of the variable reactance circuit is determined to provide matching in the 900 MHz band, and as a result point P9 moves closer to the center o.

Figure 6A:
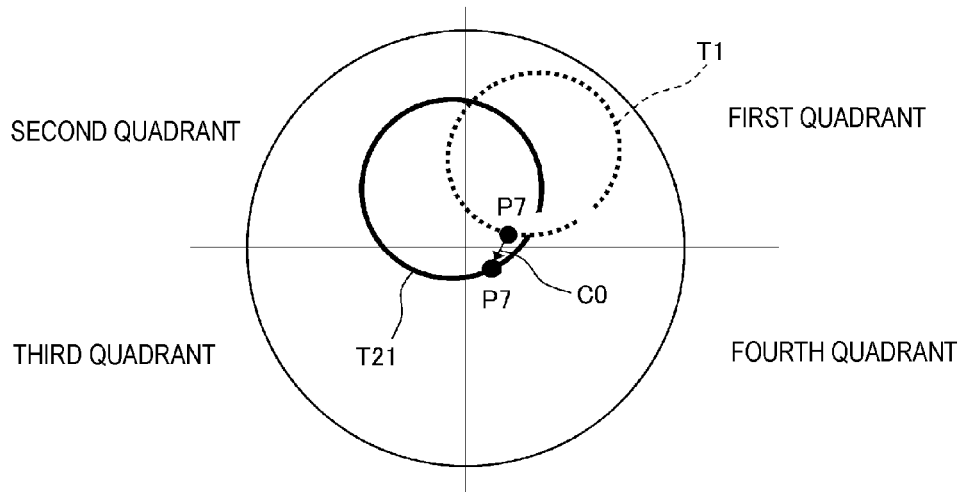
FIGS. 6A, 6B, and 6C show the operation of a variable reactance circuit.
Figure 6B:
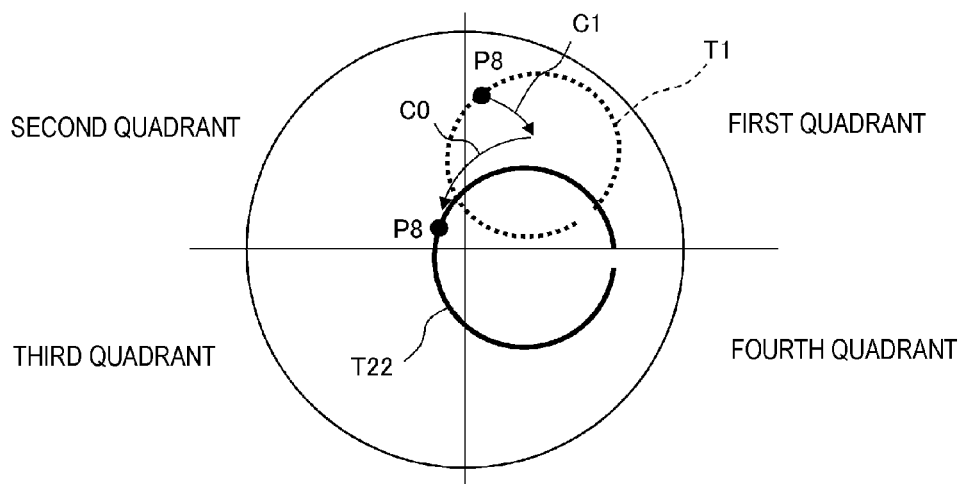
Figure 6C:
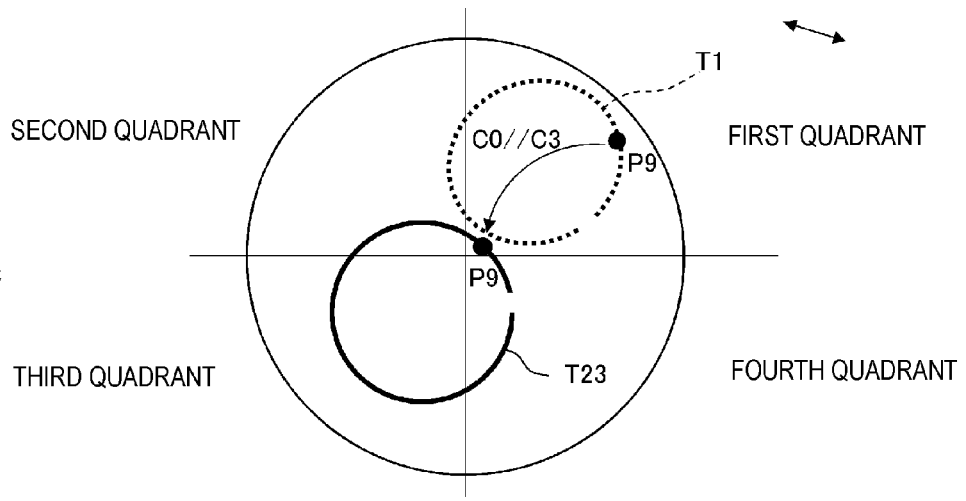

FIGS. 6A, 6B, and 6C show the operation of the variable reactance circuit 40. The states of the switch SW of the variable reactance circuit 40, which are to provide matching in the three frequency bands, are as follows.

TABLE 1

| Frequency Band | SW State |
|---|---|
| 700 MHz Band | off |
| 800 MHz Band | C1 Selected |
| 900 MHz Band | C3 Selected |

FIG. 6A shows movement of an impedance locus that occurs when the switch SW is put in a state shown in Table 1 to provide matching in the 700 MHz band. The impedance locus T1 moves as indicated by the impedance locus T21 due to the series capacitor C0 of the variable reactance circuit 40 shown in FIG. 1. Arrow C0 in FIG. 6A indicates the movement due to the series capacitor C0.

FIG. 6B shows movement of an impedance locus when the switch SW is put into a state shown in Table 1 to provide matching in the 800 MHz band. The impedance locus T1 moves as indicated by the impedance locus T22 due to the series capacitor C0 and the parallel capacitor C1 of the variable reactance circuit 40 shown in FIG. 1. In FIG. 6B, arrow C0 represents movement due to the series capacitor C0 and arrow C1 indicates the movement due to the parallel capacitor C1.

FIG. 6C shows movement of an impedance locus when the switch SW is put into a state shown in Table 1 to provide matching in the 900 MHz band. The impedance locus T1 moves as indicated by the impedance locus T23 due to the series capacitors C0 and C3 of the variable reactance circuit 40 shown in FIG. 1. Arrow C0//C3 in FIG. 6C indicates the movement due to the series capacitors C0 and C3.

With respect to the features shown in FIG. 1B, the states of the switches SW1, SW2 and SW3 of the variable reactance circuit 40B, which are to provide matching in the three frequency bands, are set as follows, for example.

TABLE 2

| Frequency Band | SW1 | SW2 | SW3 |
|---|---|---|---|
| 700 MHz Band | off | off | off |
| 800 MHz Band | on | on | off |
| 900 MHz Band | off | off | on |

As shown in FIG. 5A, the impedance locus T0 of the antenna element 20 is provided as a small circle and is moved into the first quadrant by the impedance converting circuit 30. As shown in FIGS. 6A, 6B, and 6C, the impedance locus T1, which has become a small circle in the first quadrant, is moved closer to the center of the Smith chart by the operation of the variable reactance circuit 40.

Figure 7:
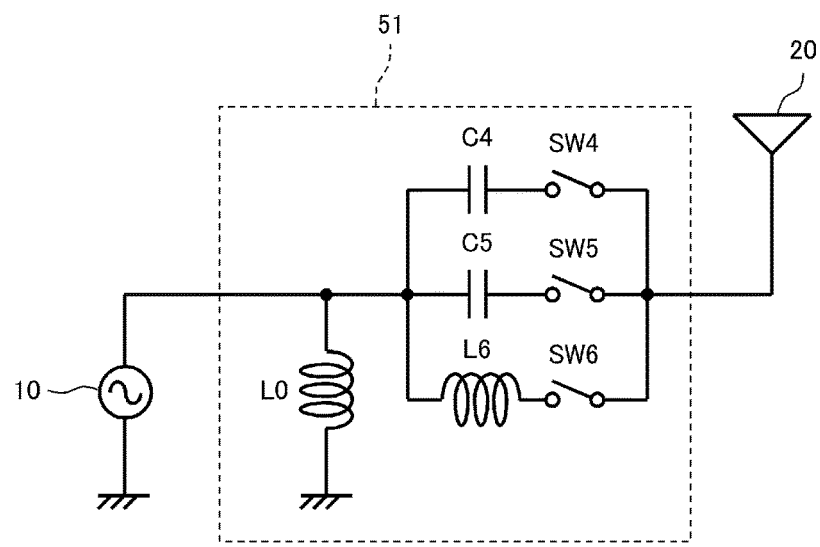
FIG. 7 is a circuit diagram of an antenna matching circuit of a comparative example.

FIG. 7 is a circuit diagram of an antenna matching circuit 51 of a comparative example. As shown in FIG. 7, the antenna matching circuit 51 includes series capacitors C4 and C5, a series inductor L6, a parallel inductor L0, and switches SW4, SW5 and SW6.

Figure 8:
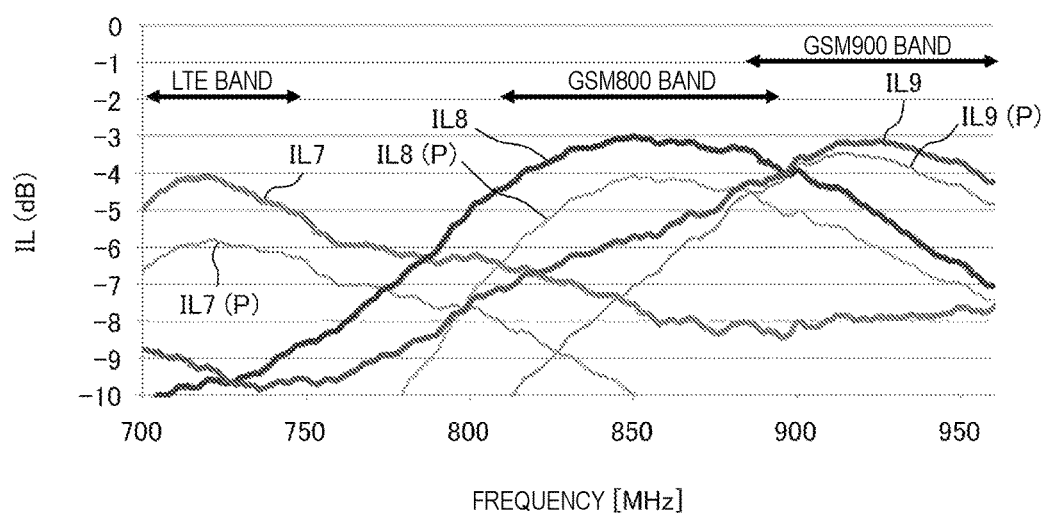
FIG. 8 shows the frequency characteristics of insertion loss of the antenna matching circuit shown in FIG. 1 and the antenna matching circuit shown in FIG. 7.

FIG. 8 shows the frequency characteristics of insertion loss of the antenna matching circuit 50 shown in FIG. 1 and the antenna matching circuit 51 shown in FIG. 7. In FIG. 8, curve IL7 shows the characteristics provided when the variable reactance circuit 40 provides matching in the 700 MHz band, curve IL8 shows the characteristics provided when the variable reactance circuit 40 provides matching in the 800 MHz band and curve IL9 shows the characteristics provided when the variable reactance circuit 40 provides matching in the 900 MHz band. Furthermore, curve IL7(P) shows characteristics provided when the antenna matching circuit 51 provides matching in the 700 MHz band, curve IL8(P) shows the characteristics provided when the antenna matching circuit 51 provides matching in the 800 MHz band and curve IL9(P) shows the characteristics provided when the antenna matching circuit 51 provides matching in the 900 MHz band.

In the antenna device according to the first preferred embodiment, the antenna matching circuit 50 includes the combination of the impedance converting circuit 30, which includes a transformer with the structure of an auto transformer circuit, and the variable reactance circuit 40, and consequently loss due to the switch is reduced and the insertion loss characteristics are improved by about 1.7 dB at most as shown in FIG. 8.

Figure 9A:
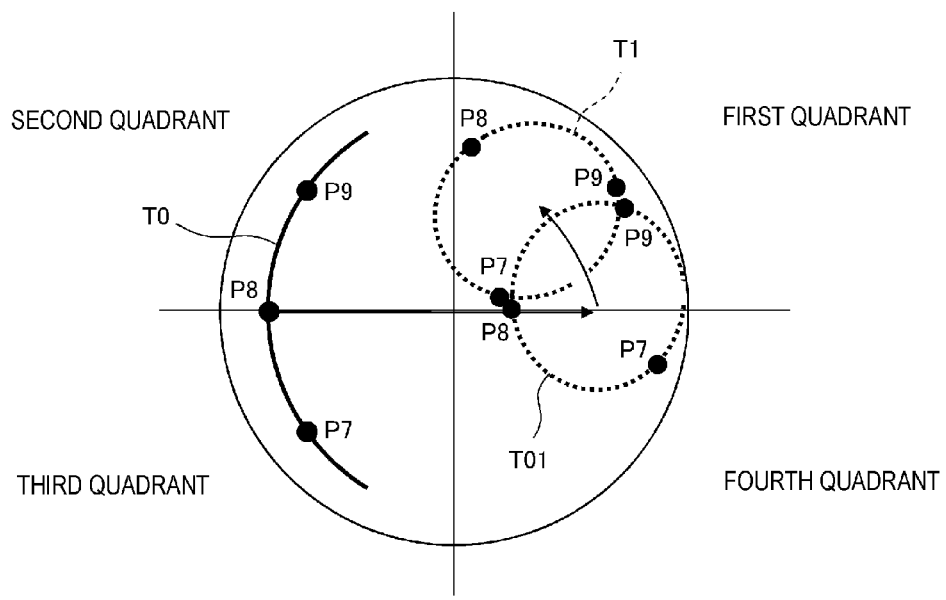
FIGS. 9A and 9B show movement of an impedance locus provided by an antenna matching circuit including a conventional structure.

If the impedance converting circuit 30 were to include a transformer that does not have a frequency dependence, the impedance locus of the antenna element 20 would become a small circle and move toward higher impedances as indicated by T01 in FIG. 9A. In order to move the impedance locus T01 toward the center of the Smith chart, the impedance locus would move toward the center by the reactance element after being temporarily moved to the first quadrant or the second quadrant, for example, as shown in FIG. 9A. In contrast, in the first preferred embodiment, since the impedance converting circuit 30 includes an auto transformer circuit, the impedance locus T0 of the antenna element 20 is provided as a small circle and is moved to the first quadrant or the second quadrant (FIG. 5A) by the action of the parallel parasitic inductance and the impedance converting circuit 30 shown in FIG. 2C. Therefore, the distance through which the impedance locus moves toward the center of the Smith chart is short and degradation of the band characteristics is able to be significantly reduced or prevented. In addition, the number of reactance elements is able to be reduced and the variable reactance circuit is able to be simplified.

Figure 9B:
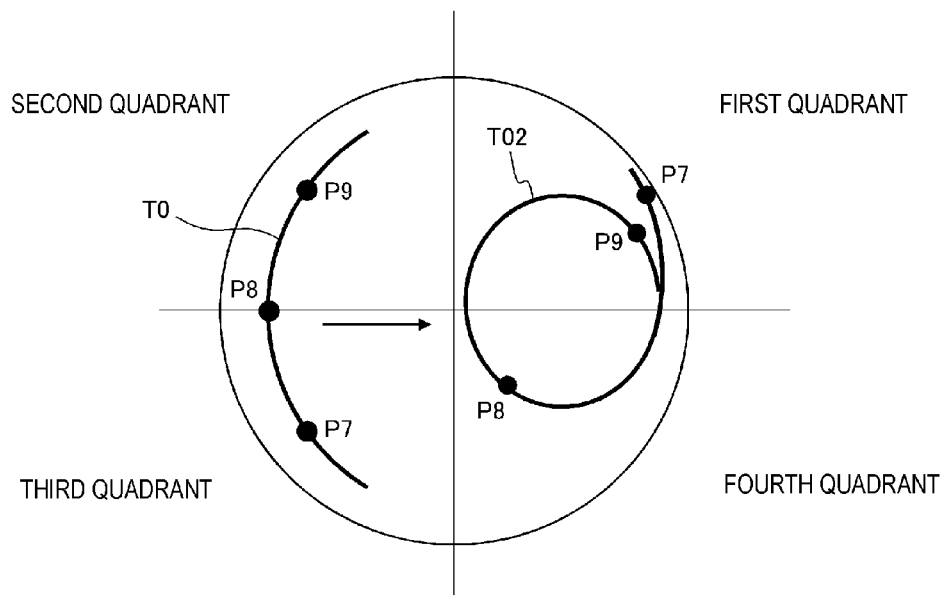

If impedance matching were attempted with a reactance element and without including a transformer, the impedance locus would become elongated due to the frequency characteristics (frequency dependence) of the reactance element and the frequency band in which matching could be provided would be very narrow. For example, as shown by the impedance locus T02 in FIG. 9B, the antenna device is greatly shifted from the resonant state at point P7 (700 MHz band) and a large loss occurs even if matching is provided in this frequency band. In addition, if impedance conversion is performed by a parallel inductor for example, the impedance would be very low at about 800 MHz to about 960 MHz. Therefore, loss due to a switch would become very large in these frequency bands, and it would be difficult to provide matching across a wide band. In contrast, in the first preferred embodiment, impedance conversion is performed by a transformer and, therefore, narrowing of the bandwidth does not occur and loss due to matching being performed with a reactance element does not occur.

Second Preferred Embodiment

A second preferred embodiment of the present invention will particularly focus upon reducing insertion loss due to a switch.

Figure 10:
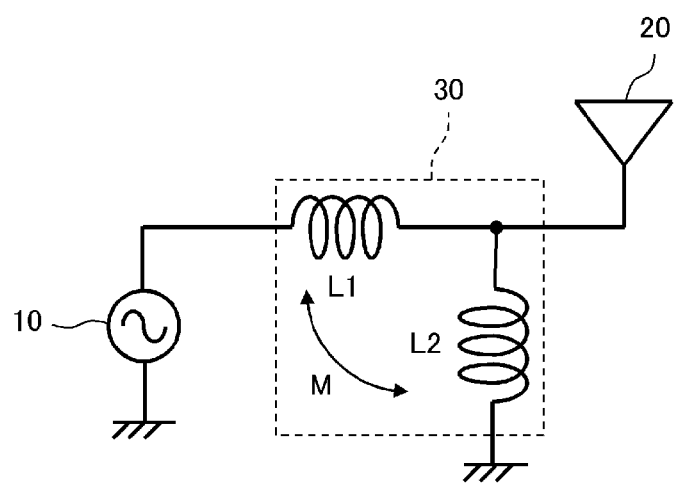
FIG. 10A shows a connection of an impedance converting circuit according to a second preferred embodiment of the present invention.
FIG. 10B shows the locus of an impedance seen from the feeder circuit as shown in FIG. 10A.
Figure 10B:
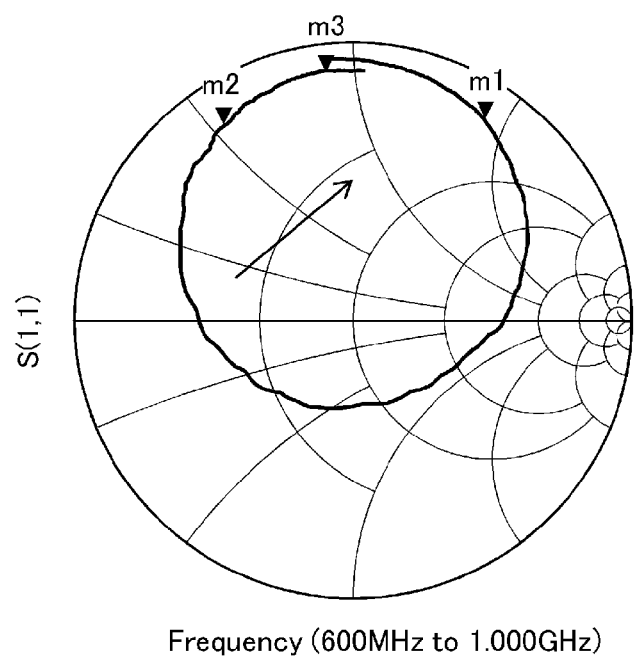
Figure 11A:
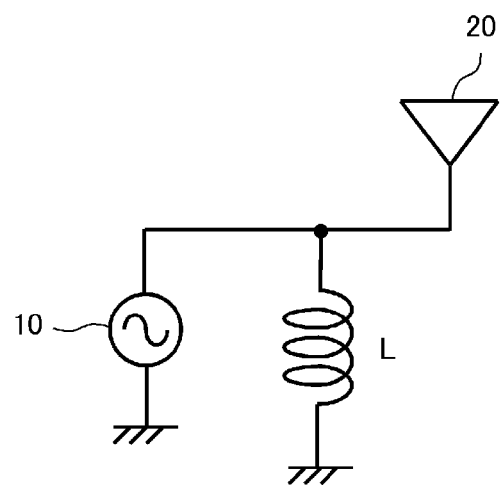
FIG. 11A shows a connection of an impedance matching circuit of a comparative example.
Figure 11B:
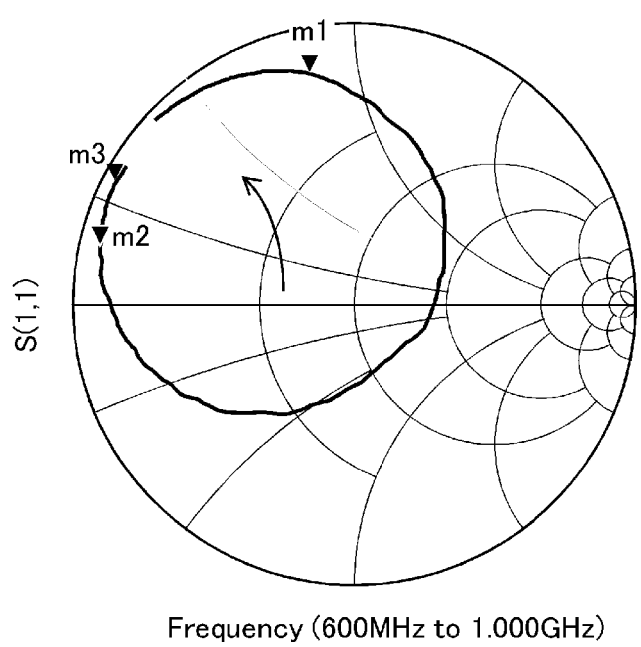
FIG. 11B shows the locus of an impedance seen from the feeder circuit as shown in FIG. 11A.

FIG. 10A shows a connection of an impedance converting circuit according to the second preferred embodiment. The impedance converting circuit 30 of the second preferred embodiment is the same as or similar to the impedance converting circuit 30 according to the first preferred embodiment. FIG. 10B shows the locus of an impedance seen from the feeder circuit 10 as shown in FIG. 10A. FIG. 11A shows a connection of an impedance matching circuit of a comparative example. As shown in FIG. 11A, the matching circuit includes a parallel-connected inductor L. FIG. 11B shows the locus of an impedance seen from the feeder circuit 10 as shown in FIG. 11A.

In FIG. 10B, the frequencies and the impedances seen from the feeder circuit 10 of markers m1, m2, and m3 on the impedance locus are as follows.
[m1]
700 MHz
15.6+j90.0 Ω
[m2]
880 MHz
5.69+j26.7 Ω
[m3]
960 MHz
4.56+j44.8 Ω

As shown in FIG. 10B, the impedance in the 700 MHz band is in the first quadrant and the impedances in the 800 MHz band and the 900 MHz band are in the second quadrant.

On the other hand, in the comparative example shown in FIGS. 11A and 11B, the frequencies and the impedances of the markers m1, m2, and m3 on the impedance locus are as follows.
[m1]
700 MHz
7.52+j40.6 Ω
[m2]
880 MHz
2.06+j5.81 Ω
[m3]
960 MHz
1.37+j12.0 Ω

In the comparative example shown in FIGS. 11A and 11B, the impedance is high in the 700 MHz band, but the impedance is very low in the 800 MHz band and the 900 MHz band. In addition, matching is not provided in the comparative example shown in FIGS. 11A and 11B. Thus, although the parallel-connected inductor L increases the impedance in a certain frequency band, the parallel-connected inductor L is not able to provide impedance matching across a wide bandwidth.

Figure 12A:
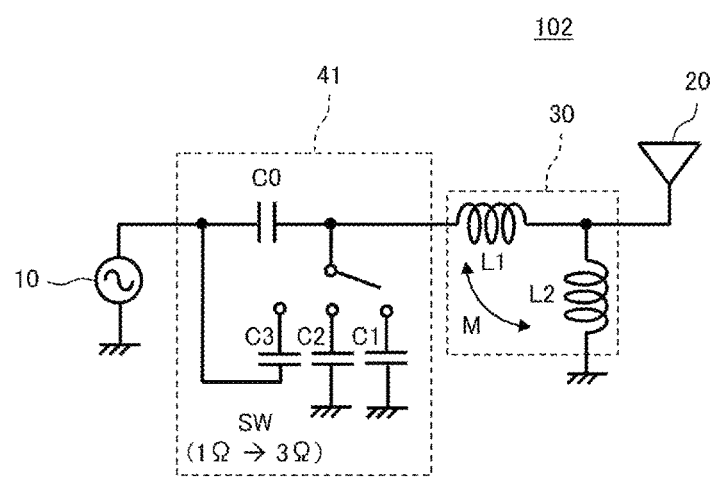
FIG. 12A is a circuit diagram of an antenna device that provides the characteristics shown in FIG. 10B and includes an antenna and the impedance converting circuit as shown in FIG. 10A.

FIG. 12A is a circuit diagram of an antenna device 102 that provides the characteristics shown in FIG. 10B, and includes an antenna and the impedance converting circuit 30 as shown in FIG. 10A. As shown in FIG. 12A, a variable reactance circuit 41 is inserted between the impedance converting circuit 30 and the feeder circuit 10. The variable reactance circuit 41 includes a single pole triple throw (SP3T) (switch) switch SW and capacitors C0, C1, C2 and C3.

Figure 12B:
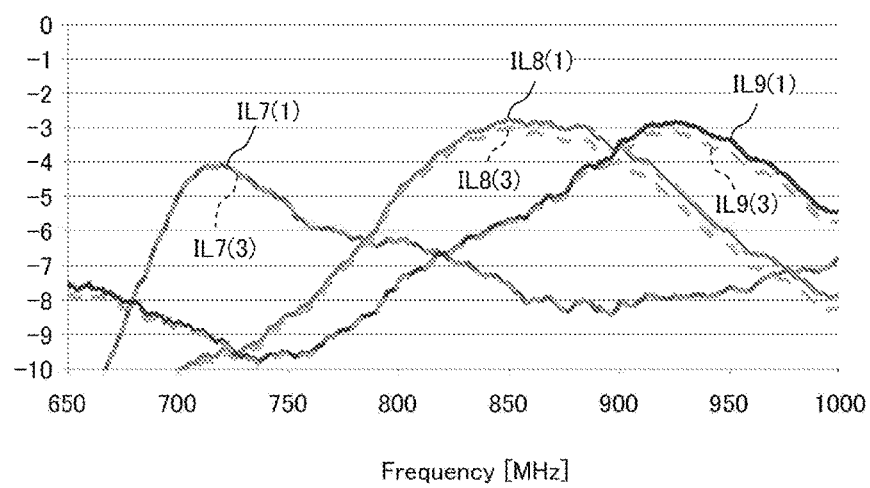
FIG. 12B shows the frequency characteristics of the insertion loss of the antenna device shown in FIG. 12A.

FIG. 12B shows the frequency characteristics of the insertion loss of the antenna device 102 shown in FIG. 12A. In FIG. 12B, curves IL7(1) and IL7(3) show the characteristics provided when the variable reactance circuit 41 provides matching in the 700 MHz band, curves IL8(1) and IL8(3) show the characteristics provided when the variable reactance circuit 41 provides matching in the 800 MHz band and curves IL9(1) and IL9(3) show the characteristics provided when the variable reactance circuit 41 provides matching in the 900 MHz band. In addition, the curves IL7(1), IL8(1) and IL9(1), which have "(1)" appended thereto, represent the characteristics provided when the resistance value of the switch SW is about 1Ω and curves IL7(3), IL8(3) and IL9(3), which have "(3)" appended thereto, represent the characteristics provided when the resistance value of the switch SW is about 3Ω. Thus, even when the resistance value of the switch SW is large, the increase in insertion loss is less than about 0.3 dB.

Figure 13:
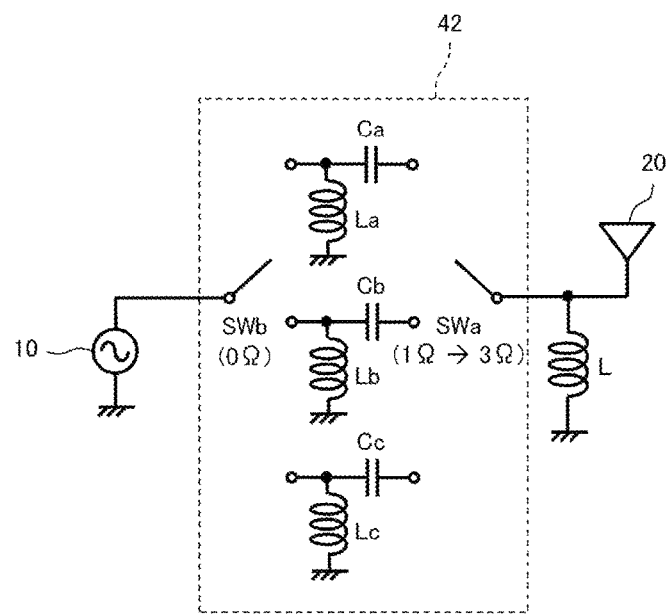
FIG. 13A is a circuit diagram of an antenna device of a comparative example that provides the characteristics shown in FIG. 11B and includes an antenna and an impedance matching circuit.
FIG. 13B shows the frequency characteristics of the insertion loss of the antenna device of the comparative example shown in FIG. 13A.

FIG. 13A is a circuit diagram of an antenna device of a comparative example that provides the characteristics shown in FIG. 11B and includes an antenna and an impedance matching circuit. As shown in FIG. 13A, a variable reactance circuit 42 is inserted between a parallel-connected inductor L and the feeder circuit 10. The variable reactance circuit 41 includes series-connected capacitors Ca, Cb and Cc, parallel-connected inductors L1, Lb and Lc, and switches SWa and SWb. Any of the three circuits including a series-connected capacitor and a parallel-connected inductor of the variable reactance circuit 42 is selected through switching of the switches SWa and SWb.

Figure 13B:
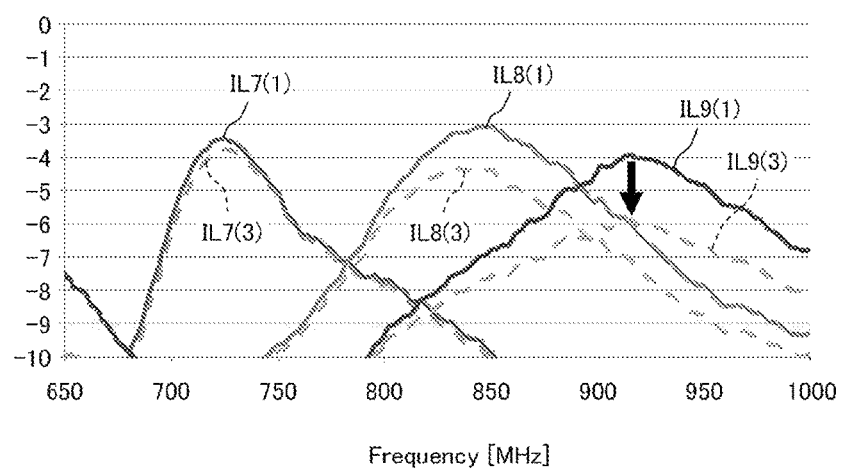

FIG. 13B shows the frequency characteristics of the insertion loss of the antenna device of the comparative example shown in FIG. 13A. In FIG. 13B, curves IL7(1) and IL7(3) show the characteristics provided when the variable reactance circuit provides matching in the 700 MHz band, curves IL8(1) and IL (3) show the characteristics provided when the variable reactance circuit 42 provides matching in the 800 MHz band and curves IL9(1) and IL9(3) show the characteristics provided when the variable reactance circuit 42 provides matching in the 900 MHz band. In addition, the curves IL7(1), IL8(1) and IL9(1), which have "(1)" appended thereto, represent the characteristics provided when the resistance value of the switch SWa is about 1Ω (resistance value of switch SWb is about 0Ω) and the curves IL7(3), IL8(3) and IL9(3), which have "(3)" appended thereto, represent the characteristics provided when the resistance value of the switch SWa is about 3Ω (resistance value of switch SWb is about 0Ω). When the resistance value of the switch SWa changes from about 1Ω to about 3Ω, the insertion loss in the 800 MHz band and the 900 MHz band increases by about 2 dB. This is because the switch is connected to a circuit with very low impedance in the 800 MHz band and the 900 MHz band and there is a strong effect due to the loss due to the switch (refer to FIG. 11B). In other words, it is due to there being large loss resulting from the switch in accordance with the termination condition of impedance matching.

In contrast to the comparative example shown in FIGS. 13A and 13B, according to the second preferred embodiment, the impedance is increased by the impedance converting circuit 30 and an effect from loss due to the switch SW of the variable reactance circuit 41 is significantly reduced or prevented. As a result, as shown in FIG. 12B, the increase in insertion loss due to providing the switch SW is very small.

Third Preferred Embodiment

In a third preferred embodiment of the present invention, a number of different features of a variable reactance circuit are described below. The portion of the antenna device other than the variable reactance circuit is the same as or similar to the first embodiment shown in FIG. 1.

FIGS. 14A, 14B, and 14C show examples of a variable reactance circuit provided when the impedance seen when looking toward the impedance converting circuit 30 from the variable reactance circuit is in the first quadrant or the fourth quadrant of a Smith chart. FIGS. 15A, 15B, and 15C show examples of a variable reactance circuit provided when the impedance seen when looking toward the impedance converting circuit 30 from the variable reactance circuit is in the second quadrant or the 3th quadrant of a Smith chart.

Figure 16:
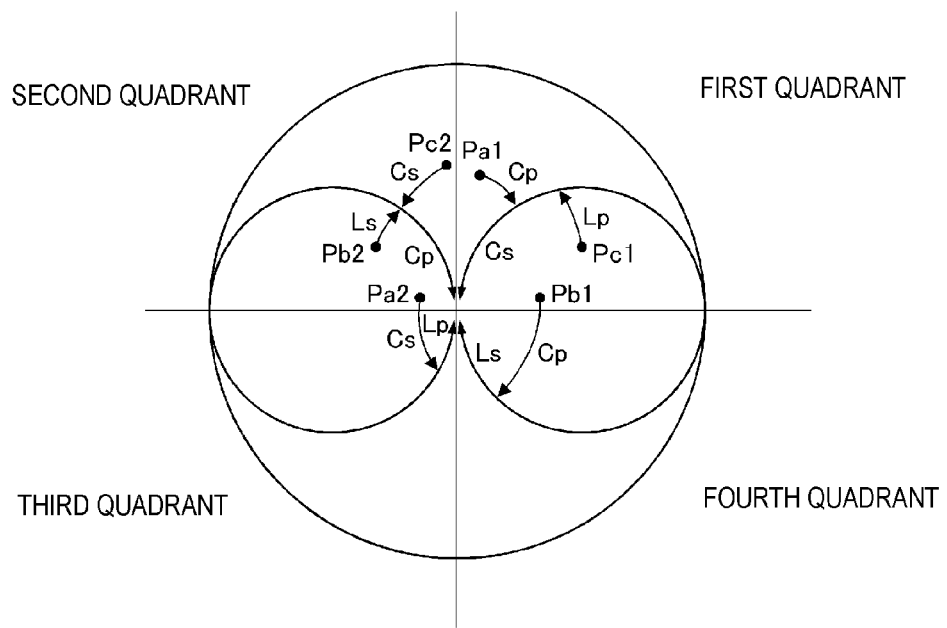
FIG. 16 shows examples of movement paths of impedance provided by the circuits shown in FIGS. 14A to 14C and 15A to 15C on a Smith chart.

FIG. 16 shows examples of movement paths of impedance provided by the circuits shown in FIGS. 14A, 14B, and 14C and FIGS. 15A, 15B, and 15C on a Smith chart.

The circuit shown in FIG. 14A is provided when the impedance seen when looking toward the impedance converting circuit 30 from the variable reactance circuit is at point Pa1 in FIG. 16. In other words, impedance matching is provided by a parallel-connected capacitor Cp and a series-connected capacitor Cs.

The circuit shown in FIG. 14B is provided when the impedance seen when looking toward the impedance converting circuit 30 from the variable reactance circuit is at point Pb1 in FIG. 16. In other words, impedance matching is provided by a parallel-connected capacitor Cp and a series-connected inductor Ls.

The circuit shown in FIG. 14C is provided when the impedance seen when looking toward the impedance converting circuit 30 from the variable reactance circuit is at point Pc1 in FIG. 16. In other words, impedance matching is provided by a parallel-connected inductor Lp and a series-connected capacitor Cs.

The circuit shown in FIG. 15A is provided when the impedance seen when looking toward the impedance converting circuit 30 from the variable reactance circuit is at point Pa2 in FIG. 16. In other words, impedance matching is provided by a series-connected capacitor Cs and a parallel-connected inductor Lp.

The circuit shown in FIG. 15B is provided when the impedance seen when looking toward the impedance converting circuit 30 from the variable reactance circuit is at point Pb2 in FIG. 16. In other words, impedance matching is provided by a series-connected inductor Ls and a parallel-connected capacitor Cp.

The circuit shown in FIG. 15C is provided when the impedance seen when looking toward the impedance converting circuit 30 from the variable reactance circuit is at point Pc2 in FIG. 16. In other words, impedance matching is provided by a series-connected capacitor Cs and a parallel-connected capacitor Cp.

As described above, impedance matching is provided by a series-connected reactance element and a parallel-connected reactance element. Switching of a series reactance element or parallel reactance element is performed by a switch to provide, approximately, predetermined values of a series-connected reactance element and a parallel-connected reactance element, in accordance with the frequency band. In particular, when a plurality of parallel-connected reactance elements with different values are switched between by a switch, an element with the highest impedance is normally connected and an element with a lower impedance than that element is connected by a switch. Thus, since the element that is normally connected is not connected via a switch, there is no loss (distortion) due to a switch. In addition, it is possible to significantly reduce or minimize the number of times the switch is switched (number of switches through which a signal passes), the loss due to a switch is able to be significantly reduced or prevented, and an inexpensive switch is able to be included.

Fourth Preferred Embodiment

Figure 17:
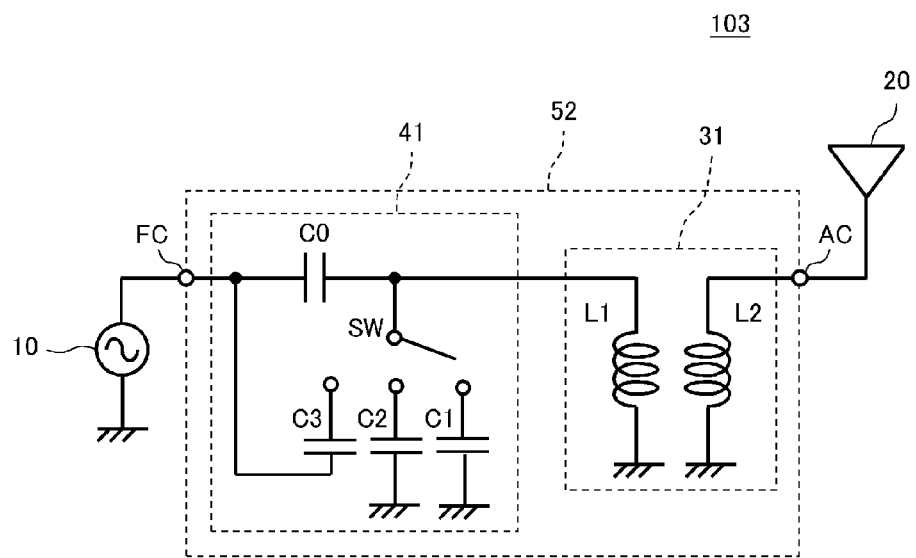
FIG. 17 is a circuit diagram of an antenna matching circuit and an antenna device according to a fourth preferred embodiment of the present invention.

FIG. 17 shows a circuit diagram of an antenna matching circuit 52 and an antenna device 103 according to a fourth preferred embodiment of the present invention. The antenna device 103 includes an antenna element 20 and an antenna matching circuit 52. A feeder circuit 10 is connected to a feeder circuit connection portion FC of the antenna matching circuit 52 and the antenna element 20 is connected to an antenna element connection portion AC. The antenna matching circuit 52 includes an impedance converting circuit 31, which is connected to the antenna element 20 side of the antenna matching circuit 52, and a variable reactance circuit 41, which is connected to the feeder circuit 10 side of the antenna matching circuit 52.

The impedance converting circuit 31 includes a first inductance element L1 and a second inductance element L2, which are transformer coupled with each other.

The variable reactance circuit 41 includes series-connected capacitors C0 and C1, parallel-connected capacitors C2 and C3 and a switch SW.

Figure 18:
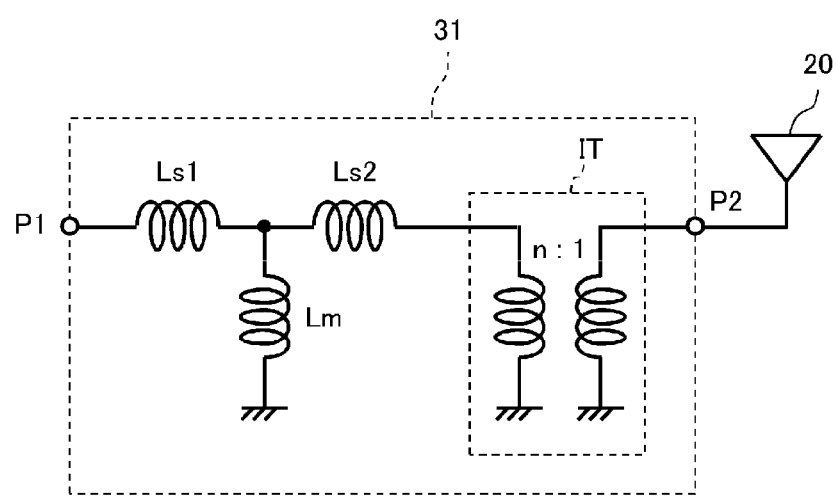
FIG. 18 is an equivalent circuit diagram of an impedance converting circuit according to the fourth preferred embodiment of the present invention.

FIG. 18 is an equivalent circuit diagram of the impedance converting circuit 31. As shown in FIG. 18, the impedance converting circuit 31 is shown as including a T circuit, which includes three inductance elements Ls1, Ls2 and Lm, and an ideal transformer IT. Here, the inductance element Lm is an excitation inductance, the inductance element Ls1 is a primary-side leakage inductance and the inductance element Ls2 is a secondary-side leakage inductance converted on the primary side. When the leakage inductances Ls1 and Ls2 are small, the locus of the impedance seen when looking toward the antenna element 20 via the impedance converting circuit 31 is primarily located in the first quadrant of the Smith chart due to the action of the parallel-connected inductance element Lm similarly to as in the circuit shown in FIG. 2C. Therefore, impedance matching is able to be provided by the operation of the variable reactance circuit as in the first preferred embodiment.

Fifth Preferred Embodiment

Figure 19:
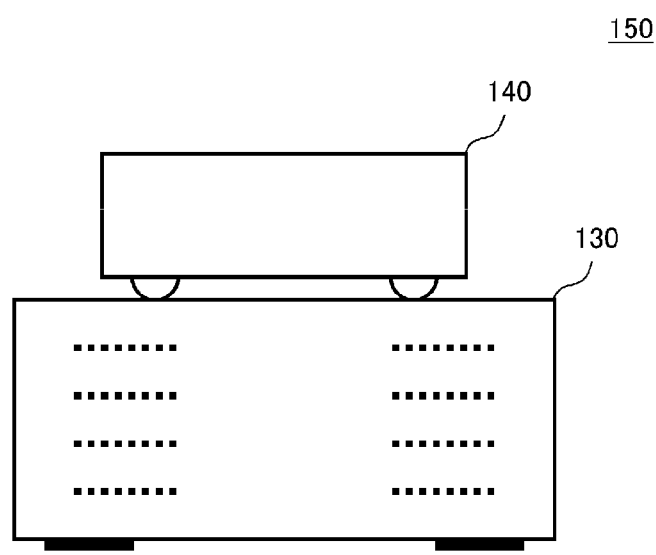
FIG. 19 is a schematic front view of an antenna matching circuit module according to a fifth preferred embodiment of the present invention.

FIG. 19 is a schematic front view of an antenna matching circuit module 150 according to a fifth preferred embodiment of the present invention. The antenna matching circuit module 150 includes a transformer unit 130 and a switch-switching circuit 140. The transformer unit 130 is preferably a chip that includes conductor patterns in a multilayer element body, which is formed by stacking a plurality of dielectric substrate layers on top of one another. Various conductor patterns that define the impedance converting circuit 30 shown in FIG. 4 are provided inside the multilayer element body, for example. In addition, various reactance elements such capacitor patterns that define the variable reactance circuit are provided inside the multilayer element body. Electrodes, which enable mounting of the switch-switching circuit 140, are located on the upper surface of the transformer unit 130. Mounting electrodes are located on the lower surface of the transformer unit 130.

The switch-switching circuit 140 is preferably an SP3T FET switch chip, for example. The switch-switching circuit 140 is mounted on the upper surface of the transformer unit 130.

The variable reactance circuit may be provided by mounting chip capacitors and chip inductors on the upper surface of the transformer unit 130.

By providing the antenna matching circuit as a module as described above, the antenna matching circuit is able to be reduced in size and furthermore loss is reduced.

An antenna matching circuit is able to be easily provided by mounting the thus-modularized antenna matching circuit module 150 on a circuit board.

Sixth Preferred Embodiment

Figure 20:
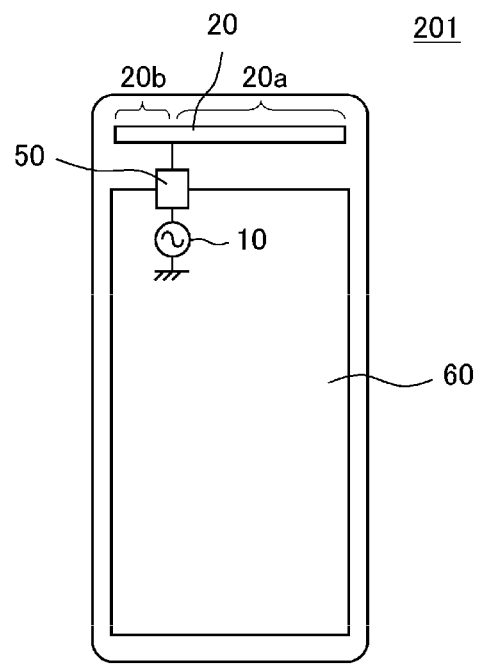
FIG. 20 shows a wireless communication device such as a cellular phone terminal according to a sixth preferred embodiment of the present invention.
Figure 21:
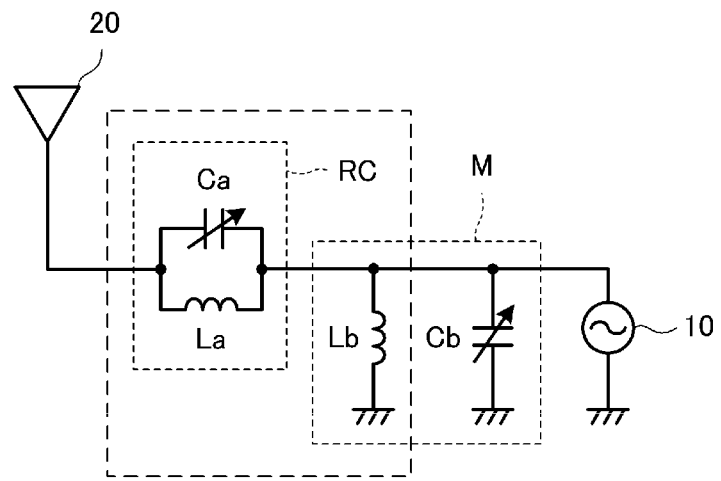
FIG. 21 shows an antenna device of Japanese Unexamined Patent Application Publication No. 2011-55258.

FIG. 20 shows a wireless communication device 201, such as a cellular phone terminal, according to a sixth preferred embodiment of the present invention. In FIG. 20, only the main portions inside the casing of the wireless communication device 201 are shown. An antenna element 20 and a circuit board are provided inside the casing, a ground conductor is provided on the circuit board, and an antenna matching circuit 50 and a feeder circuit 10, which is a wireless communication circuit, are provided on the circuit board.

The antenna element 20 defines a T-branch-type antenna in which two radiating elements 20a and 20b are connected from the feeder circuit 10. The radiating element 20a is designed to include an electrical length to undergo $\lambda/4$ resonance in a low band (700 MHz-960 MHz band, for example) ($\lambda$: wavelength of low band). The radiating element 20b is designed to include an electrical length to undergo $\lambda/4$ resonance in a high band (1.7 GHz-2.1 GHz band, for example) ($\lambda$: wavelength of high band). The operational principle of this antenna is merely an example. For example, the entire radiating element (20a+20b) may be designed to undergo $(3/4)\lambda$ resonance in the high band.

Although examples have been described in the above preferred embodiments in which matching is provided in the 700 MHz band, the 800 MHz band, and the 900 MHz band in a low band, the preferred embodiments may be similarly applied to a high band (1.7 GHz-2.1 GHz band, for example). Accordingly, the impedance converting circuit 30 and the variable reactance circuit 40 would be provided in accordance with the characteristics of the antenna element 20 in the high band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna matching circuit that is connected between a feeder circuit connection portion, which is connected to a feeder circuit, and an antenna element connection portion, which is connected to an antenna element, the antenna matching circuit comprising:
   an impedance converting circuit; and
   a variable reactance circuit that is connected between the feeder circuit and the impedance converting circuit; wherein the impedance converting circuit includes a first inductance element and a second inductance element, which are transformer coupled with each other; and the variable reactance circuit includes:
- a reactance element that is connected in parallel or series with a transmission/reception signal transmission path; and
- a switch that switches a connection state of the reactance element.

2. The antenna matching circuit according to claim 1, wherein:
the first inductance element is connected in series with the transmission/reception signal transmission path; and
the second inductance element is connected in parallel with a connection point between the first inductance element and the antenna element.

3. The antenna matching circuit according to claim 1, wherein:
the reactance element includes a first reactance element that is connected in series with the transmission/reception signal transmission path; and
the reactance element includes a second reactance element that is connected in parallel with the transmission/reception signal transmission path by the switch.

4. The antenna matching circuit according to claim 3, wherein the reactance element further includes a third reactance element that is connected in parallel with the first reactance element by the switch.

5. An antenna matching circuit module that is connected between a feeder circuit connection portion, which is connected to a feeder circuit, and an antenna element connection portion, which is connected to an antenna element, the antenna matching circuit module comprising:
an impedance converting circuit; and
a variable reactance circuit that is connected between the feeder circuit and the impedance converting circuit; wherein
the impedance converting circuit includes a first inductance element and a second inductance element, which are transformer coupled with each other and are included in a multilayer element body including a plurality of dielectric layers that are stacked; and
the variable reactance circuit includes:
- a reactance element that is mounted on or included in the multilayer element body and is connected in parallel or series with a transmission/reception signal transmission path; and
- a switch that is mounted on the multilayer element body and switches a connection state of the reactance element.

6. The antenna matching circuit according to claim 5, wherein:
the first inductance element is connected in series with the transmission/reception signal transmission path; and
the second inductance element is connected in parallel with a connection point between the first inductance element and the antenna element.

7. The antenna matching circuit according to claim 5, wherein:
the reactance element includes a first reactance element that is connected in series with the transmission/reception signal transmission path; and
the reactance element includes a second reactance element that is connected in parallel with the transmission/reception signal transmission path by the switch.

8. The antenna matching circuit according to claim 7, wherein the reactance element further includes a third reactance element that is connected in parallel with the first reactance element by the switch.

9. An antenna device comprising:
an antenna element; and
an antenna matching circuit that is connected to the antenna element; wherein
the antenna matching circuit is the antenna matching circuit according to claim 1.

10. A wireless communication device comprising:
an antenna device; and
a wireless communication circuit that is connected to the antenna device; wherein
the antenna device is the antenna device according to claim 9.

11. The antenna matching circuit according to claim 1, wherein the impedance converting circuit is defined by conductor patterns included in a multilayer element body.

12. The antenna matching circuit according to claim 11, wherein the multilayer element body includes a plurality of stacked dielectric substrate layers.

13. The antenna matching circuit according to claim 3, wherein the first reactance element is a capacitor that is connected in series with the transmission/reception signal transmission path.

14. The antenna matching circuit according to claim 3, wherein the second reactance element is a capacitor that is selectively connected in parallel with the transmission/reception signal transmission path by the switch.

15. The antenna matching circuit according to claim 3, wherein the second reactance element includes at least two capacitors that are individually and selectively connected in parallel with the transmission/reception signal transmission path by the switch.

16. The antenna matching circuit according to claim 4, wherein the third reactance element is a capacitor that is selectively connected in parallel with the first reactance element by the switch.

17. The antenna matching circuit according to claim 1, wherein:
the reactance element includes a plurality of reactance elements;
the switch includes a plurality of switches; and
each of the plurality of switches selectively connects a corresponding one of the plurality of reactance elements.

18. The antenna matching circuit according to claim 1, wherein the impedance converting circuit is an auto transformer circuit.

* * * * *